United States Patent [19]

Nakamura et al.

[11] Patent Number: 5,499,442
[45] Date of Patent: Mar. 19, 1996

[54] DELAY LINE DEVICE AND METHOD OF MANUFACTURING THE SAME

[75] Inventors: Nakaba Nakamura; Makoto Kosaki, both of Kyoto, Japan

[73] Assignee: Susumu Co., Ltd., Kyoto, Japan

[21] Appl. No.: 271,732

[22] Filed: Jul. 7, 1994

Related U.S. Application Data

[62] Division of Ser. No. 140,539, Oct. 25, 1993, Pat. No. 5,365,203.

[30] Foreign Application Priority Data

Nov. 6, 1992 [JP] Japan ..................... 4-322383

[51] Int. Cl.⁶ ..................................... H01P 11/00
[52] U.S. Cl. ..................... 29/600; 29/830; 29/841
[58] Field of Search ............. 29/830, 841, 600; 333/138, 140, 156, 161, 162, 238, 240

[56] References Cited

U.S. PATENT DOCUMENTS

| | | |
|---|---|---|
| 4,641,113 | 2/1987 | Ozawa . |
| 4,864,722 | 9/1989 | Lazzarini et al. ................ 29/830 |
| 4,930,215 | 6/1990 | Roche et al. ..................... 29/830 |
| 5,032,803 | 7/1991 | Koch .......................... 29/830 X |
| 5,384,952 | 1/1995 | Matsui ........................ 29/830 X |

FOREIGN PATENT DOCUMENTS 2-92210  7/1990  Japan .

Primary Examiner—S. Thomas Hughes
Attorney, Agent, or Firm—Oblon, Spivak, McClelland, Maier & Neustadt

[57] ABSTRACT

A delay line device having first and second substrates. The first substrate has a signal line centrally formed on one of main surfaces of a ceramic substrate, bonding electrodes formed in a peripheral portion of the main surface and a ground electrode formed over substantially the entire region of the other main surface thereof. The second substrate has bonding electrodes formed on one of main surfaces of the ceramic substrate identical in thickness and material to the ceramic substrate and a ground electrode formed over substantially the entire region of the other main surface thereof. The delay line device is formed by superimposing the first and second substrates on one another so that the bonding electrodes of the first substrate face those of the second substrate and bonding the bonding electrodes of both substrates to one another. Such delay line devices can be manufactured using mother substrates and mother dummy substrates.

2 Claims, 11 Drawing Sheets

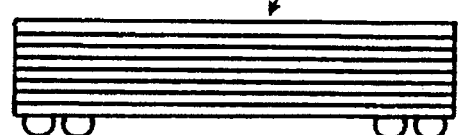
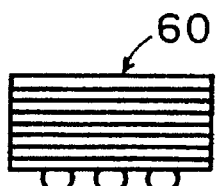
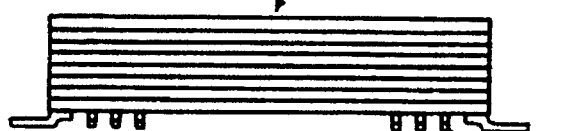
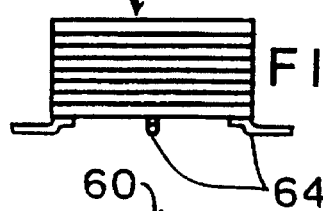
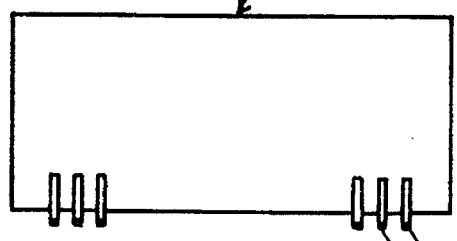
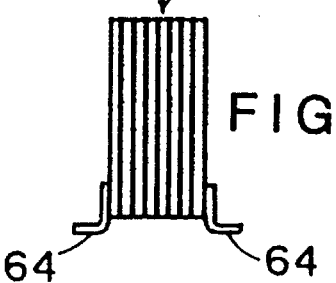
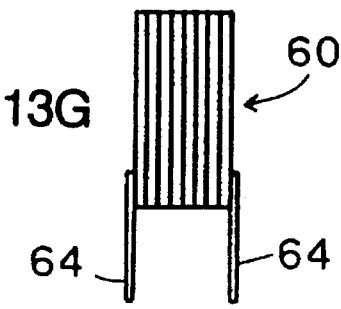
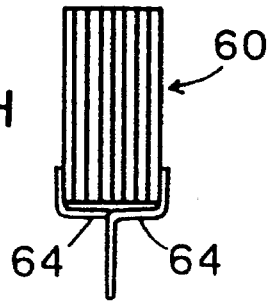

DELAY LINE DEVICE AND METHOD OF MANUFACTURING THE SAME

This is a division of application Ser. No. 08/140,539, filed on Oct. 15, 1993, now U.S. Pat. No. 5,365,203.

BACKGROUND OF THE INVENTION

1. Field of the Invention

The present invention relates to a delay line device used to delay an electric signal such as a pulse signal employed in an electronic apparatus such as a communication device and a computer, and to a method of manufacturing such delay line devices.

2. Description of the Prior Art

As one of such delay line devices, there has heretofore been known a non-distributed constant type delay line device wherein a coil and a capacitor have been combined together. Since, however, the upper limit of a frequency to be used is low, this delay line device cannot be applied to a high-speed transmission circuit.

In order to improve this frequency characteristic, there has been proposed a distributed constant type delay line device disclosed, for example, in U.S. Pat. No. 4,641,113. This delay line device can handle a high-speed signal (i.e., a high-frequency signal) having a pulse width or rise time of 1 nanosecond or less.

This type of delay line device is of a microstrip line structure. As is apparent from FIG. 14 showing a schematic cross section of the delay line device, the delay line device has a signal conductor or line 4 bent in a zigzag manner, for example, which is formed on one of main surfaces of a dielectric substrate 2, and a ground electrode 6 formed on substantially the entire area of the other main surface thereof.

Since, however, the signal line 4 is electrically exposed, the delay line device has a problem that the signal line 4 is subjected to electromagnetic influences from the outside and electromagnetic noise is also produced from the signal line 4 itself.

Such a problem can be solved by making use of a delay line device of a so-called triplate type stripline structure provided with dielectric substrates 2 and ground electrodes 6 respectively formed on the upper and lower surfaces of a signal line 4 as shown in FIG. 15 representative of a schematic cross section of the delay line device. Such a triplate type delay line device is, however, accompanied by a problem that the accuracy of geometric dimensions between the signal line 4 and the respective upper and lower ground electrodes 6 exerts a substantial influence upon electrical characteristics such as an impedance and a delay time (or a time delay).

Described more specifically, it is necessary to set distances $L_1$ and $L_2$ between the signal line 4 and the upper ground electrode 6 and between the signal line 4 and the lower ground electrode 6 so as to be equal to each other and to uniformly set the distances over the entire length of the signal line 4. If these distances $L_1$ and $L_2$ vary, the impedance of a signal transmission line varies. As a result, an increase in reflection of a signal is made and waveform distortion is developed. A variation in impedance exerts an influence even on a delay time. The impedance and the delay time greatly vary according to the frequency, particularly in a high-frequency range.

Upon actually fabricating the aforementioned triplate type delay line device, resinous substrates are conventionally used as the dielectric substrates 2 to bond the upper and lower dielectric substrates to each other with the signal line 4 interposed therebetween. Then, the resinous substrates are bonded to each other by heating under pressure. Alternatively, where ceramic substrates are used as the dielectric substrates 2, a means such as a method of interposing a bonding resinous sheet between the ceramic substrates is used. In either case, the geometric dimensions between the signal line 4 and the upper and lower ground electrodes 6 vary subtly. It was, therefore, difficult to materialize a delay line device whose electrical characteristics remain stable up to a high-frequency range.

On the other hand, a size reduction in recent electric parts and the integration of the same into a high density, which have been required of the electric parts, are similarly required of the delay line device. There is now a demand for the development of a delay line device which is small in size, long in delay time and can respond to a high-speed signal. In order to meet such a demand, such a delay line device as has been disclosed in Japanese Utility Model Laid-open Gazette No. 2-92210 was developed. This type of delay line device is constructed in the following manner. As illustrated in FIG. 16 in an exploded manner, the aforementioned signal lines 4 are formed on respective ones of main surfaces of dielectric substrates 2 and ground electrodes 6 are formed on substantially the entire regions of the other main surfaces of the dielectric substrates 2. The products, i.e., dielectric substrates thus obtained in plural form are bonded to one another by heating under pressure with sheets 8 made of organic materials interposed therebetween. The so-produced delay line device has a multi-layered triplate type stripline structure. The signal lines 4 provided within the respective layers are electrically series-connected to one another via through holes or the like.

This type of delay line device is small in size, long in delay time and can cope with a high-speed signal. It is also possible to solve the aforementioned problem of electromagnetic induction since the delay line device is of the triplate type. However, the geometrical dimensions between the signal lines 4 and their corresponding upper and lower ground electrodes 6 vary subtly since the sheets 8 are used to bond the respective dielectric substrates 2 formed with the signal lines 4 to one another. Thus, a problem still remains that difficulty rises in ensuring the stability of electrical characteristics up to a high-frequency range.

SUMMARY OF THE INVENTION

It is, therefore, a principal object of the present invention to provide a delay line device capable of improving the accuracy of a geometrical dimension between a signal line and each of upper and lower ground electrodes and hence providing electrical characteristics stable up to a high-frequency range and to a method of manufacturing such delay line devices.

Described briefly, according to one aspect of the present invention, there is provided a delay line device comprising a first substrate having a signal line centrally formed on one of main surfaces of a ceramic substrate, bonding electrodes formed in a peripheral portion of the main surface, a ground electrode formed over substantially the entire region of the other main surface thereof, means for providing electrical connections between the ground electrode and the bonding electrodes; and a second substrate having bonding electrodes formed on one of main surfaces of a ceramic substrate identical in thickness and material to the ceramic substrate of the first substrate and at positions respectively corresponding to the bonding electrodes of the first substrate, a ground electrode formed over substantially the entire region of the other main surface of the ceramic substrate, and means for providing electrical connections between the ground electrode and the bonding electrodes. Further, the delay line device is also constructed in the following manner. The first and second substrates are stacked on one another in such a manner that the bonding electrodes of the first substrate and the bonding electrodes of the second substrate are respectively disposed in facing relationship to one another. Further, the opposed bonding electrodes of the first and second substrates are bonded to one another by brazing in such a manner that the signal line of the first substrate is brought into contact with the ceramic substrate of the second substrate.

The present invention has a principal advantage that the delay line device can be materialized wherein the equality of distances between the signal line and the upper and lower ground electrodes employed in the delay line device to each other can be ensured over the entire length of the signal line and hence the accuracy of geometrical dimensions between the signal line and the upper and lower ground electrodes can be made high and electrical characteristics can be stabilized up to a high-frequency range.

The present invention also has other advantage that since the delay line device is of a triplate type stripline structure, the delay line device can cope with a high-speed signal and is not affected by the electromagnetic induction.

According to another aspect of the present invention, further advantages are brought about in that (1) since dummy substrates are provided on both sides of the delay line device, terminals for external connections can be freely taken out and hence the convenience for use of the delay line device is improved, (2) the dummy substrates serve as reinforcing materials and hence the overall mechanical strength of the delay line device is improved, (3) the dummy substrates serve as the reinforcing materials and hence a pressure applying process can be easily effected where it is desired to stack the substrates on one another and heat the same under pressure, and (4) since the dummy substrates enable through holes to be cut off from being exposed to the air, the weatherproofness of the delay line device can be improved.

According to a further aspect of the present invention, a plurality of delay line units, which form a delay line device, are stacked on one another and signal lines of the respective delay line units are series-connected to each other to thereby produce a layered structure. It is, therefore, possible to materialize the delay line device which has the aforementioned excellent characteristics and which is small in size and long in delay time. Since the delay line units whose delay time intervals differ from each other can be freely set in combination, a wide range of choice can be made to the delay time.

According to a still further aspect of the present invention, the bonding of the electrodes is effected by brazing or soldering by the use of a gold-tin alloy. Therefore, the bonding makes it unnecessary to use flux dissimilarly to soldering by the use of a tin-lead alloy. Thus, a further advantage can be obtained in that aftertreatment or the like of the bonding becomes easy.

According to a still further aspect of the present invention, a resin having a dielectric constant lower than each of both ceramic substrates of the stacked first and second substrates is charged into spacings between both ceramic substrates.

Therefore, a further advantage can be brought about in that the weatherproofness of the delay line device is improved and the mechanical strength thereof is also improved.

According to the manufacturing method of the present invention, a plurality of delay line devices can be manufactured at a time using the mother substrates and the mother dummy substrates. Therefore, the efficiency of production of the delay line devices and their productivity can be improved. Further, the plurality of delay line devices whose characteristics are uniform can be easily obtained.

The above and other objects, features and advantages of the present invention will become apparent from the following description and the appended claims, taken in conjunction with the accompanying drawings in which preferred embodiments of the present invention are shown by way of illustrative example.

BRIEF DESCRIPTION OF THE DRAWINGS

FIGS. 3A through 3C show a first substrate which forms the delay line unit shown in FIG. 1, wherein FIG. 3A is a top plan view, FIG. 3B is a side view and FIG. 3C is a back plan view;

FIGS. 4A through 4C show a second substrate which forms the delay line unit shown in FIG. 1, wherein FIG. 4A is a top plan view, FIG. 4B is a side view and FIG. 4C is a reverse side view;

FIGS. 13 through 13H show several examples of shapes of delay line devices according to the present invention, wherein FIG. 13A is a front view of a soldering bump type delay line device, FIG. 13B is a side view thereof, FIG. 13C is a front view of a flat package type delay line device, FIG. 13D is a side view thereof, FIG. 13E is a front view of a small outline package type delay line device, FIG. 13F is a side view thereof, FIG. 13G is a side view of a dual in-line package type delay line device and FIG. 13H is a side view of a single in-line package type delay line device;

DETAILED DESCRIPTION OF THE INVENTION

Figure 1:
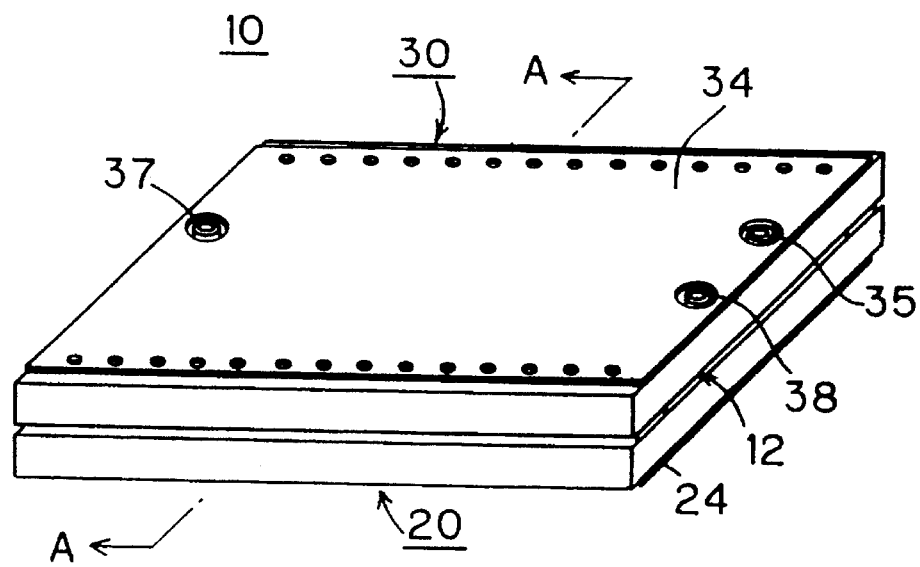
FIG. 1 is a perspective view showing one example of a delay line unit which forms a delay line device according to the present invention.
Figure 2:
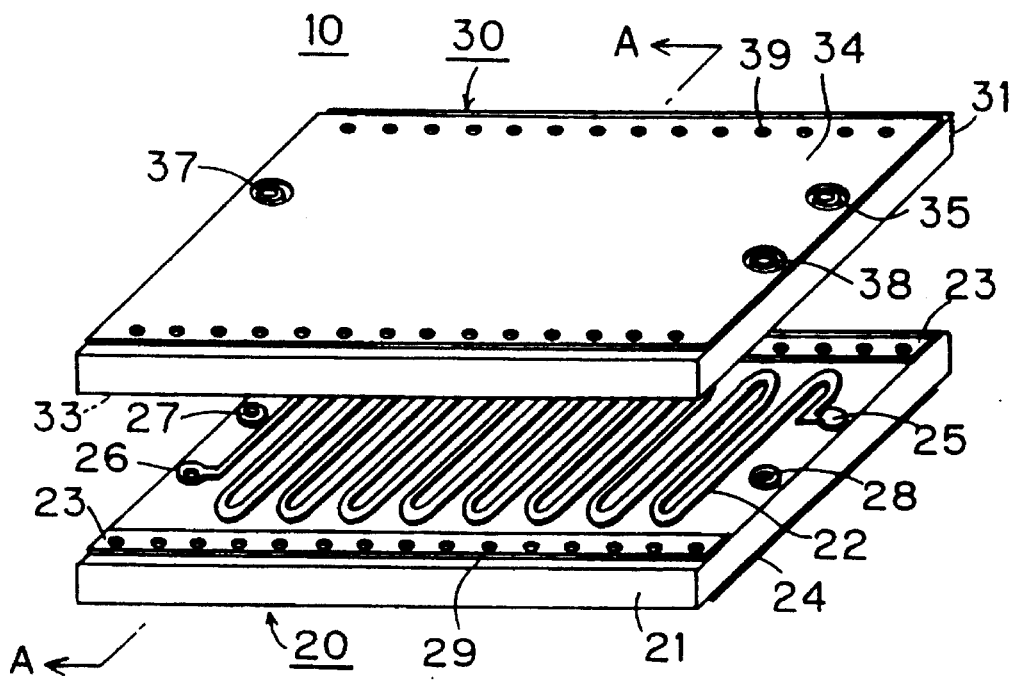
FIG. 2 is an exploded perspective view illustrating the delay line unit shown in FIG. 1.

FIG. 1 is a perspective view illustrating one example of a delay line unit which forms a delay line device according to the present invention. FIG. 2 is an exploded perspective view of the delay line unit shown in FIG. 1.

The delay line unit 10 is formed by bonding first and second substrates 20 and 30 to each other by brazing or soldering. The method of bonding them will be described later by specific examples.

Figure 3A:
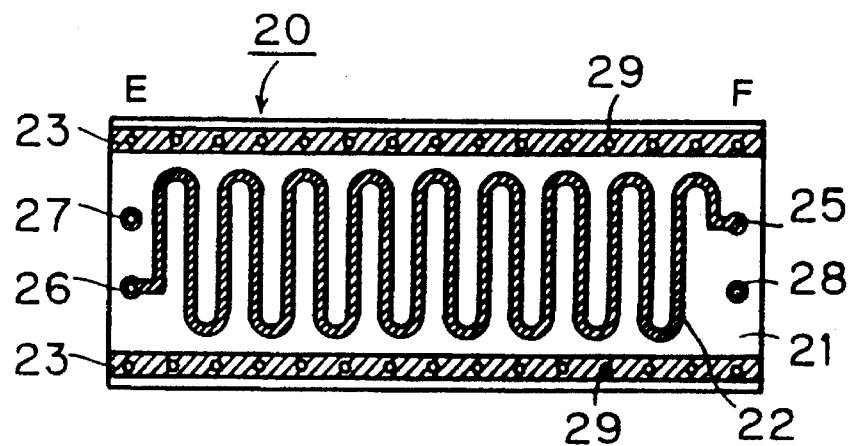
Figure 3B:
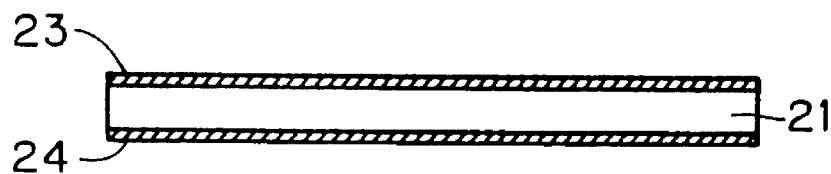
Figure 3C:
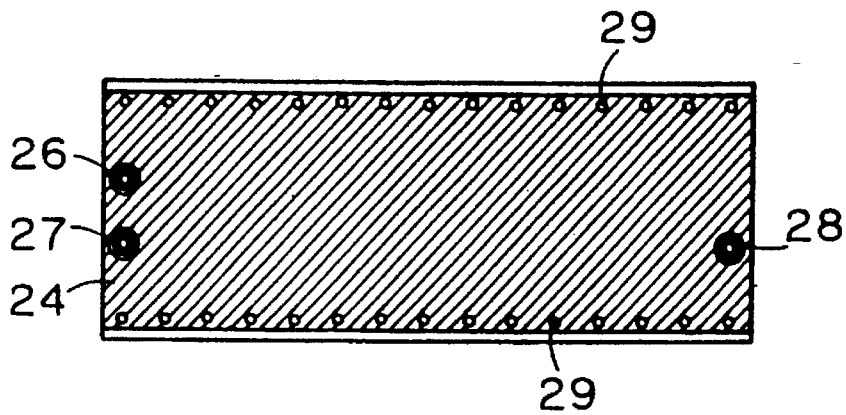

Referring to FIGS. 3A through 3C as well, the first substrate 20 has a signal conductor or line 22 centrally formed on one of main surfaces of a ceramic substrate 21, two boding electrodes 23 each shaped in the form of a strip in the present embodiment, which are formed in a peripheral portion of the main surface and a ground electrode 24 formed over substantially the entire region of the other main surface of the ceramic substrate 21. The ground electrode 24 and the bonding electrodes 23 are electrically connected to each other through a large number of through holes 29 (described more specifically, conductors formed within the same through holes 29) in the present embodiment.

In the present embodiment, alumina ($Al_2O_3$) is used as a material for the ceramic substrate 21. However, other material such as glass, mullite ($3Al_2O_3.2SiO_2$) or aluminum nitride (AlN) may be used as an alternative to this material according to specifications such as a required characteristic impedance.

The shape of the signal line 22 varies in different form according to a required delay time. When the required delay time is long, for example, the signal line 22 may be set to a zigzag and bent shape as illustrated in the drawing as one example. When, on the other hand, the required delay time is short, the signal line 22 may be simply linear.

In the present embodiment, a connecting terminal 25 and through hole terminal 26 are respectively connected to both ends of the signal line 22. The "through hole terminal" refer to terminals which are provided at both ends extending upward and downward of a through hole and electrically connected to each other through the through hole (described more specifically, a conductor formed within the through hole). In the present embodiment as well, connecting through holes 27 and 28, which are circuitally separated from one another, are further formed in the periphery of the signal line 22.

However, the terminals may be either simple terminals or through hole terminals. Further, the number of terminals, the position of each terminal and the like are not necessarily limited to those set in the present embodiment. They may be changed according to a structure in which such terminals are connected to other delay line unit and terminals for external connections. Terminals to be attached to a second substrate 30 and dummy substrates 40 and 50, which will be described later, are treated in the same manner as described above.

Figure 4A:
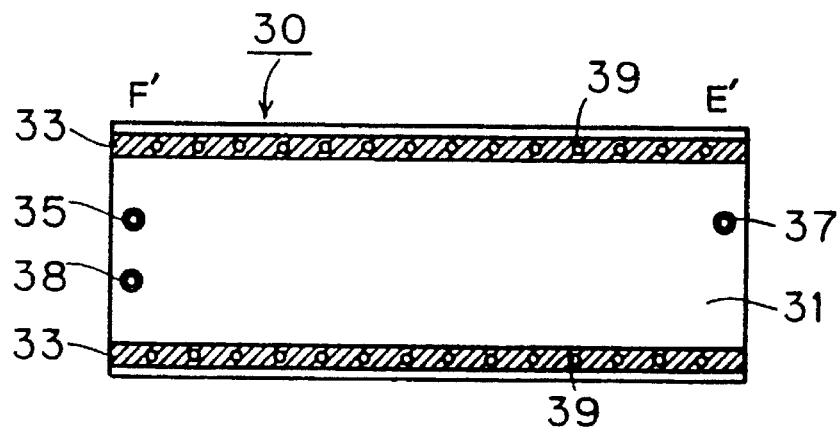
Figure 4B:
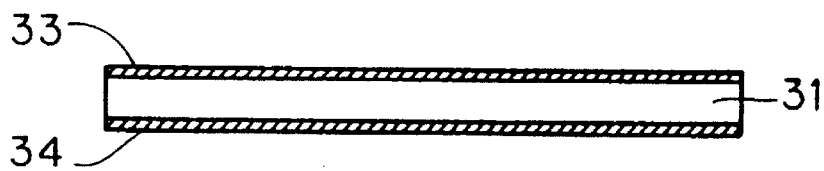
Figure 4C:
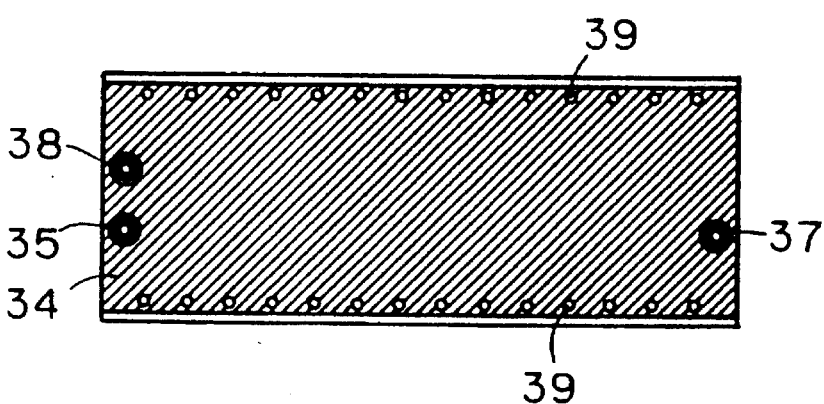

Referring to FIGS. 4A through 4C too, the second substrate 30 has bonding electrodes 33 formed on one of main surfaces of a ceramic substrate 31 and at positions respectively corresponding to the two bonding electrodes 23 of the first substrate 20, and a ground electrode 34 formed over substantially the entire region of the other main surface of the ceramic substrate 31. The ground electrode 34 and the bonding electrodes 33 are electrically connected to each other through a large number of through holes 39 in a manner similar to the first substrate 20. The ceramic substrate 31 of the second substrate 30 is identical in thickness and material to the ceramic substrate 21 of the first substrate 20.

Further, the second substrate 30 has circuitally-separated respective connecting through hole terminals 35, 37 and 38, which are formed in a peripheral portion of the second substrate 30 and provided at positions corresponding to the terminal 25 and the through hole terminals 27 and 28 of the first substrate 20.

The delay line unit 10 shown in FIG. 1 is formed in the following manner. The first and second substrates 20 and 30 are superimposed on each other in such a manner that the bonding electrodes 23 and 33 are disposed in opposing relationship to each other as shown in FIG. 2. Described more specifically, the second substrate 30 depicted in FIGS. 4A through 4C is stacked on the first substrate 20 shown in FIGS. 3A through 3C with the bonding electrode 33 set downward in such a manner that a portion E shown in FIG. 3A and a portion E' shown in FIG. 4A, and a portion F depicted in FIG. 3A and a portion F' illustrated in FIG. 4A are respectively brought into alignment with one another. Further, the bonding electrodes 23 of the first substrate 20 and the bonding electrodes 33 of the second substrate 30, which are respectively provided in opposing relationship, are bonded to one another by brazing or soldering in such a manner that the signal line 22 is brought into contact with its corresponding ceramic substrate 31.

A description will now be made of a more specific example of such a bonding means. All the conductors including the signal line 22, bonding electrodes 23 and the ground electrode 24 provided on both main surfaces of the first substrate 20 are formed by two layers, i.e., a thick film made of copper (Cu) and a thin film made of gold (Au) provided on the copper thick film as in the example shown in FIG. 5. In order to make an improvement in adhesion between the copper and the first substrate 20, an alloy of nickel and chromium is often provided between the two. However, the alloy between the two has been omitted from the drawing in this example, which is the same with the second substrate 30.

On the other hand, all the conductors including the bonding electrodes 33 and the ground electrode 34 respectively provided on both main surfaces of the second substrate 30 are formed by three layers, i.e., a thick film made of copper, a thin film made of gold provided on the copper thick film, and a thin film made of tin (Sn) provided on the gold thin film. However, the overall thickness of each bonding electrode 33 is formed thin to the order of a few µm, for example in order to bring the signal line 22 into contact with the ceramic substrate 31 when the bonding electrodes 23 and 33 are bonded to each other. Each of conductors of the first and second substrates 20 and 30, other than all the conductors referred to above is formed to the order of several tens of µm in thickness, for example.

Figure 6:
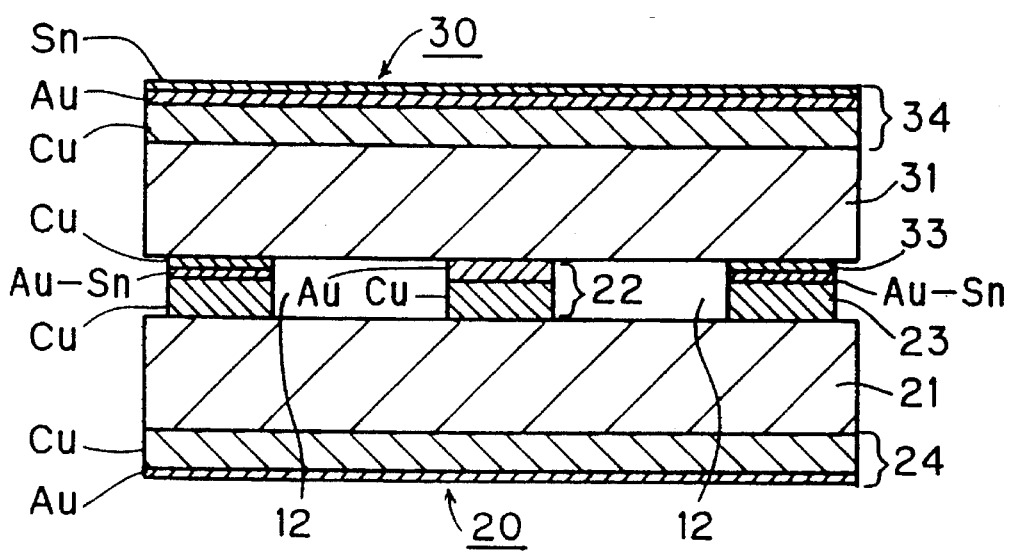
FIG. 6 is an enlarged schematic cross-sectional view explaining a method of bonding the first and second substrates to each other and corresponding to a sectional view taken along line A—A of FIG. 1.

Then, the first and second substrates 20 and 30 are stacked on each other in such a way that the bonding electrodes 23 and 33 are disposed in facing relationship to each other. Thereafter, the resultant laminate is subjected to applied pressure and heated to 300° C. or so. Thus, as shown in FIG. 6, the gold and tin, which have been in contact with each other, are mutually diffused to produce a gold-tin eutectic alloy. As a result, the bonding electrodes 23 and 33 are bonded to each other. Since, at this time, the bonding electrodes 33 are originally extremely thin in thickness and the gold and tin on the surfaces of the bonding electrodes 33 mutually diffuse into the corresponding gold on the bonding electrodes 33 so as to produce the gold-tin alloy, the surface of the signal line 22 on the first substrate 20 is substantially brought into contact with the surface of the ceramic substrate 31 on the second substrate 30 without any spacing.

Simultaneously with the above bonding, the terminal 25 and through hole terminal 35, through hole terminals 27 and 37, and through hole terminals 28 and 38 are respectively bonded to one another in the delay line unit 10.

Since such a gold-tin alloy has a melting point of about 280° C., which is sufficiently higher than that (about 180° C.) of a normally-used tin-lead (Sn—Pb) solder, the product after completed as a delay line device can be prevented from being affected by heat given upon soldering the device on a printed circuit board or the like.

The bonding using such a gold-tin alloy belongs to brazing or solderling. More specifically, the bonding can be called soldering rather than brazing because the melting point of the alloy is less than 450° C.

It is also preferable that the bonding is effected in a non-oxidizing atmosphere such as a nitrogen atmosphere to prevent the tin from oxidation.

The use of flux is unnecessary if the bonding is made using the gold-tin alloy. It is, therefore, unnecessary to remove the flux after completion of its bonding. Thus, aftertreatment or the like becomes easy. It is, however, needless to say that, for example, soldering using a tin-lead alloy whose melting point (whose content of lead is increased if described more specifically) is higher than that of the normally-used tin-lead solder may be used as an alternative to the bonding using a gold-tin alloy.

Further, a resin having a dielectric constant lower than each of both ceramic substrates 21 and 31 may be charged into spacings 12 (see FIGS. 1 and 6) existing between the ceramic substrates 21 of the first substrate 20 and the ceramic substrate 31 of the second substrates 30. In doing so, advantageous effects can be brought about in that (1) since water or moisture can be prevented from entering into the periphery of the signal line 22, an improvement in weatherproofness is made; and (2) since an area for adhesion between the upper and lower substrates 20 and 30 is increased, an improvement in mechanical strength is made, for example. The use of the resin having the dielectric constant lower than that each of the ceramic substrates 21 and 31 is to reduce deterioration in electrical characteristics such as a frequency characteristic of the delay line unit 10, which is caused by the charging of the resin into the spacings. Examples of the resin include an epoxy resin, a polyimide resin, etc. A vacuum impregnating method may preferably be used as such a resin charging method. However, a method of slowly sinking the delay line unit 10 into the resin in the atmosphere and the like may be used.

The delay line unit 10 shown in FIG. 1 has the structure described above. Without the use of, for example, an adhesive sheet made of an organic material, which develops a dimensional variation, the first and second substrates 20 and 30 can also be joined to each other by bonding the respective bonding electrodes 23 and 33 to each other by brazing or soldering, thereby enabling the signal line 22 to be brought into contact with the corresponding ceramic substrate 31. Therefore, the distance between the signal line 22 and each of the upper and lower ground electrodes 24 and 34 is decided depending on the thickness of each of the upper and lower ceramic substrates 21 and 31. Since the ceramic substrates 21 and 31 are identical in thickness to each other, the distances between the signal line 22 and the respective upper and lower ground electrodes 24 and 34 are equal to each other.

Further, since each of the ceramic substrate 21 and 31 is made most uniform in thickness as compared with other dielectric substrates such as resin substrate or the like, the distances between the signal line 22 and the respective upper and lower ground electrodes 24 and 34 are ensured equally to each other over the entire length of the signal line 22.

Therefore, the accuracy of a geometric dimension between the signal line 22 and each of the ground electrodes 24 and 34 is high. As a result, the delay line unit 10 capable of providing electrical characteristics stable up to a high frequency range can be realized.

Since the delay line unit 10 also has a triplate-type stripline structure, it can be operated in response to a high-speed signal and is not affected by the electromagnetic induction.

Only one delay line unit 10 may be used as a delay line device according to a required delay time, more specifically where the required delay time is short. In this case, the delay line device may be constructed by bonding two dummy substrates 40 and 50 to be described later to the upper and lower sides of the delay line unit 10. The structure of each of the dummy substrates 40 and 50 and advantageous effects for the provision of the dummy substrates 40 and 50, for example, will be described later in detail with reference to FIG. 7.

According to the required delay time, a layered-structure type delay line device may also be constructed by stacking the aforementioned delay line units 10 on one another in plural form and electrically connecting signal lines 22 of the respective delay line units 10 in series with each other. One example of such a delay line device will now be described below.

Figure 7:
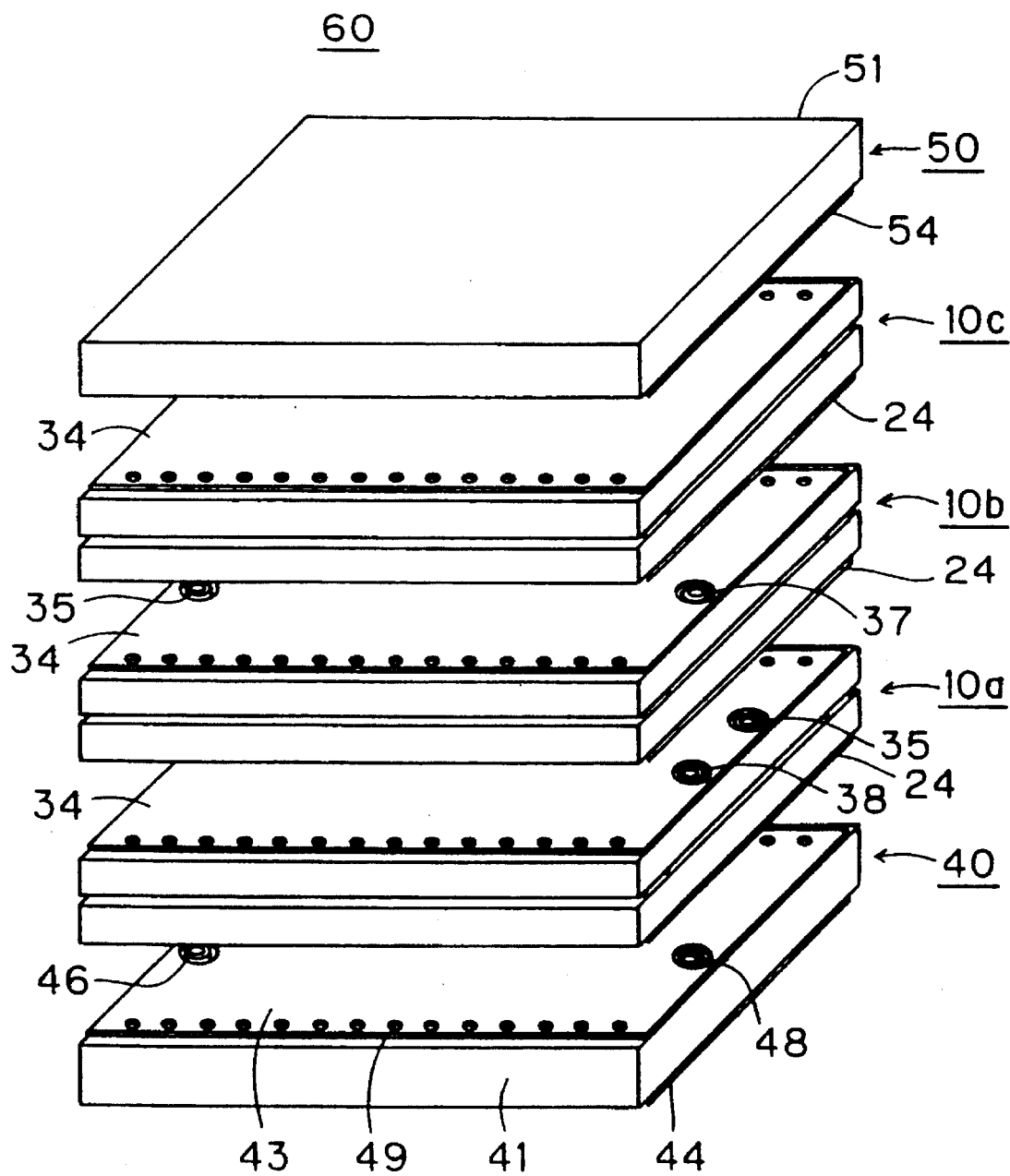
FIG. 7 is an exploded perspective view showing one example of a delay line device according to the present invention.
Figure 8:
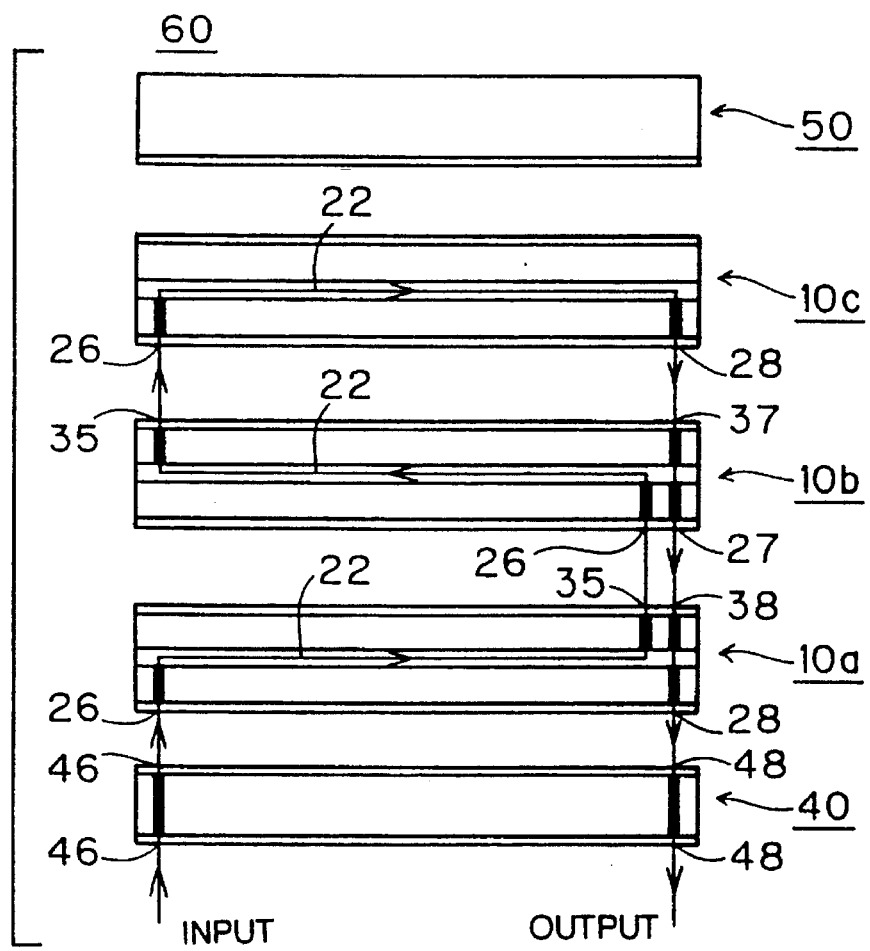
FIG. 8 is a general sketch typically illustrating the flow of a signal into the delay line device shown in FIG. 7.

A delay line device 60 shown in FIG. 7 is fabricated by stacking three delay line units 10a, 10b and 10c each identical in structure to the aforementioned delay line unit 10 on one another, respectively bonding respective opposite ground electrodes 24 and 34 and respective opposite through hole terminals to one another by brazing or soldering, and joining signal lines 22 of the respective delay line units 10a through 10c in series to one another using respective through hole terminals 26, 27, 28, 35, 37 and 38 as illustrated in FIG. 8. The arrow illustrated in FIG. 8 shows the flow of a signal as an example.

Incidentally, the middle delay line unit 10b is stacked on the delay line units 10a and 10c with the left and right sides thereof reversed in position as compared with those of each of the delay line units 10a and 10c. The through hole terminals unnecessary for the connections may be suitably omitted as in the delay line unit 10c.

Further, the delay line device 60 is constructed in the following manner. Ground electrodes 43 and 44 are formed over substantially the entire regions of both main surfaces of a ceramic substrate 41 greater in thickness than each of the aforementioned ceramic substrates 21 and 31 which form the individual delay line units 10a through 10c. Further, the first dummy substrate 40 having through hole terminals 46 and 48 provided at positions respectively corresponding to the through hole terminals 26 and 28 (see FIG. 8) of the delay line unit 10a disposed on the ceramic substrate 41, and the second dummy substrate 50 having a ground electrode 54 formed over substantially the entire region of a main surface on the delay line unit 10c side, of the ceramic substrate 51 greater in thickness than each of the ceramic substrates 21 and 31 are stacked on the upper and lower sides of a combination of the delay line units 10a through 10c superimposed on each other in the above-described manner with the ground electrodes 43 and 54 oriented inwardly. Then, the respective opposite ground electrodes and the respective opposite through hole terminals are respectively bonded to one another by brazing or soldering.

It is preferable that the material of each of the ceramic substrates 41 and 51 which respectively form the dummy substrates 40 and 50, is set identical to that of each of the ceramic substrates 21 and 31 which form the individual delay line units 10a through 10c from the standpoint of the fact that thermal expansion coefficients are made coincident with each other.

A specific means for the bonding of the above respective components is identical to that which has been previously described with reference to FIGS. 5 and 6. In this example, a gold-tin alloy is used as the specific bonding means. Thus, since a thin film made of gold formed on the surface of the ground electrode 24 of the delay line unit 10a, is provided in facing relationship to the ground electrode 43 of the dummy substrate 40, a thin film made of tin is formed on the surface of the ground electrode 43. Further, thin films each made of tin are formed on the surfaces of the through hole terminals 46 and 48. Since a thin film made of tin formed on the surface of the ground electrode 34 of the delay line unit 10c is provided in facing relationship to the ground electrode 54 of the dummy substrate 50, a thin film made of gold is formed on the surface of the ground electrode 54. By doing so, the delay line units 10a through 10c, the dummy substrate 40 and the dummy substrate 50 can be bonded to one another at a time.

According to the delay line device 60, since the respective delay line units 10a through 10c respectively have excellent characteristics as described above, a delay line device having such excellent characteristics, a small-sized structure and a long delay time can be achieved.

Further, the number of the superimposed delay line units is not necessarily limited to three and may be one or more as needed. Since the delay line units whose delay time differ from each other can be freely set in combination, a wide range of choice can be made to the delay time.

The following advantageous effects can also be brought about by providing the aforementioned dummy substrates 40 and 50.

(1) Since the terminals for the external connections can be attached to each of the dummy substrates 40 and 50 in free shape and number, they can be freely taken out and hence the convenience for use of the delay line device can be improved. Examples of the terminals for the external connections are illustrated in FIG. 9 and FIGS. 13A through 13H.

(2) Since ceramic substrates 41 and 51 greater in thickness than the ceramic substrates which form the individual delay line units 10a through 10c are used for the dummy substrates 40 and 50, the dummy substrates 40 and 50 serve as reinforcing materials. Thus, the overall mechanical strength of the delay line device can be improved.

(3) Since the ceramic substrates 41 and 51 greater in thickness than the ceramic substrates constructive of the individual delay line units 10a through 10c are used for the dummy substrates 40 and 50 in the same manner as described above and the dummy substrates 40 and 50 are high in mechanical strength and hard to flex, a pressure applying process can be easily effected when it is desired to stack the delay line units 10a through 10c and the dummy substrates 40 and 50 on one another and heat them under pressure.

(4) Since the dummy substrates 40 and 50 enable a large number of through holes to be cut off from being exposed to the air even if the through holes are formed in each of the delay line units 10a through 10c, the weatherproofness of the delay line device can be improved.

Figure 9:
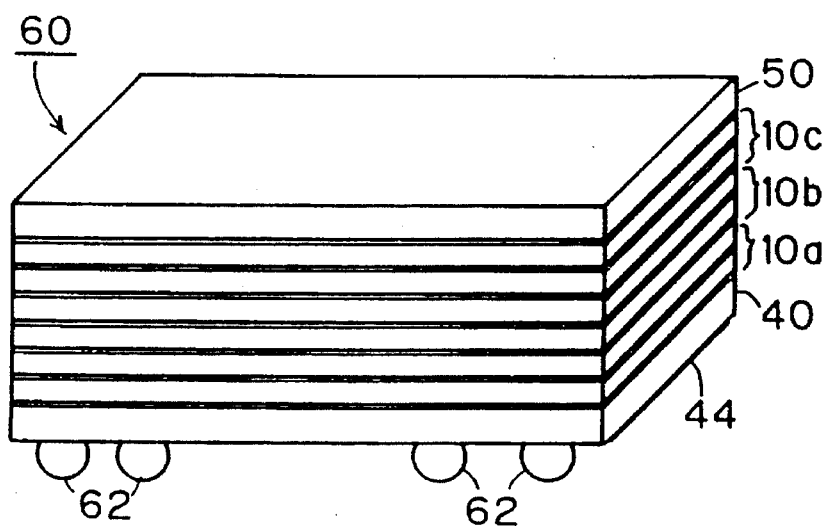
FIG. 9 is a perspective view depicting the delay line device shown in FIG. 7 to which soldering bumps have been attached.

FIG. 9 shows, as an example, a delay line device in which a terminal pattern (not shown) for the external connections is formed on the reverse face on the dummy substrate 40 side, of the delay line device 60 and a plurality of soldering bumps 62 are provided on the terminal pattern as the terminals for the external connections. Since the delay line device shown in FIG. 9 is identical to that illustrated in FIGS. 13A and 13B, a side view of the delay line device shown in FIG. 9 is seen by reference to FIG. 13B. The two of the soldering bumps 62 are electrically connected to the input and output through hole terminals 46 and 48 shown in FIG. 7 and 8, whereas the remaining bumps 62 are electrically connected to the ground electrode 44. The number and positions of the soldering bumps 62 may be decided specifically according to a circuit pattern or the like of a printed circuit board on which the delay line device 60 is mounted.

It is preferable that the components other than the soldering bumps 62 on the back of the dummy substrate 40 are covered with a resin such as a polyimide resin having high heat-resistant properties. In doing so, the ground electrode 44 can be prevented from exposure and oxidation.

A description will now be made of a method of manufacturing the delay line unit 10 and the delay line device 60. The delay line unit 10 or the delay line device 60 may be manufactured one by one. However, each of the delay line unit 10 and the delay line device 60 may be preferably manufactured in plural form at one time in accordance with the following manufacturing method.

A preferred example of a method of manufacturing delay line devices each of them having a multi-layered structure, such as the above-described delay line device 60 will now be described with reference to FIG. 10.

A plurality of first mother substrates 20a, a plurality of second mother substrates 30a and two mother dummy substrates 40a and 50a are first prepared. The number of the first mother substrates 20a and that of the second mother substrates 30a may be decided according to a required delay time.

Each of the first mother substrates 20a corresponds to the aforementioned first substrate 20 and has a plurality of conductive patterns 70 respectively including a plurality of signal lines 22 mentioned above and bonding electrodes respectively provided at peripheral portions of the signal lines 22, which are deposited on one of main surfaces of each ceramic substrate. Further, each first mother substrate 20a has a ground electrode (not shown) formed over substantially the entire region of the other main surface of each ceramic substrate, and through hole terminals (not shown) respectively provided at the peripheral portions of the signal lines 22.

Each of the second mother substrate 30a corresponds to the aforementioned second substrate 30 and has bonding electrodes respectively formed on one of main surfaces of each ceramic substrate and respectively provided at positions corresponding to the respective bonding electrodes of each mother substrate 20a. Further, each second mother substrate 30a has a ground electrode (not shown) formed over substantially the entire region of the other main surface of each ceramic substrate, and through hole terminals (not shown) respectively provided at positions corresponding to the through hole terminals of each mother substrate 20a. The ceramic substrate, which forms each second mother substrate 30a, is identical in thickness and material to the ceramic substrate which forms each first mother substrate 20a.

The mother dummy substrate 40a corresponds to the aforementioned dummy substrate 40 and has ground electrodes (not shown) formed over substantially the entire regions of both main surfaces of a ceramic substrate greater in thickness than each of the first and second mother substrates 20a and 30a. Further, the mother dummy substrate 40a has through hole terminals (not shown) respectively provided at positions corresponding to the through hole terminals of each first mother substrate 20a.

The mother dummy substrate 50a corresponds to the aforementioned dummy substrate 50 and has a ground electrode (not shown) formed over substantially the entire region of one of main surfaces of a ceramic substrate greater in thickness than each of the first and second mother substrates 20a and 30a.

Figure 5:
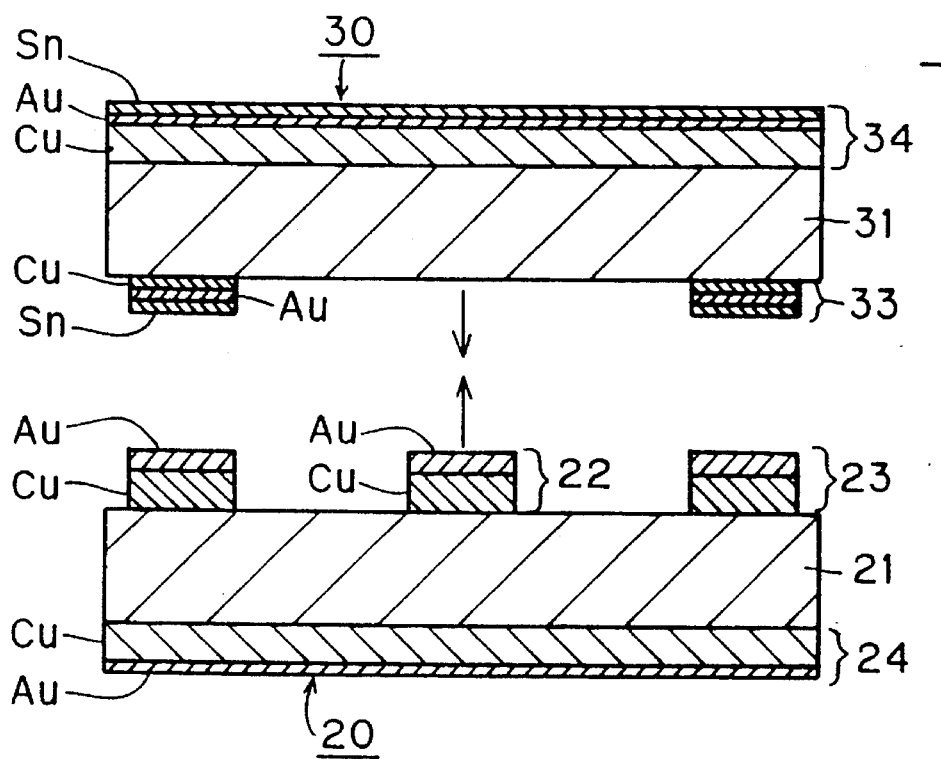
FIG. 5 is an enlarged schematic cross-sectional view explaining a method of bonding the first and second substrates to each other and corresponding to a sectional view taken along line A—A of FIG. 2.

Further, thin films each made of gold are formed on the surfaces of conductors such as the signal lines, the bonding electrodes and the through hole terminals, which are provided on both main surfaces of each first mother substrate 20a as illustrated in FIGS. 5 and 6. Thin films each made of tin are formed on the surfaces of conductors provided on both main surfaces of each second mother substrate 30a. Thin films each made of tin are formed on the surfaces of conductors provided on both main surfaces of the mother dummy substrate 40a. Further, a thin film made of gold is formed on the surface of a conductor (ground electrode) of the mother dummy substrate 50a.

Figure 10:
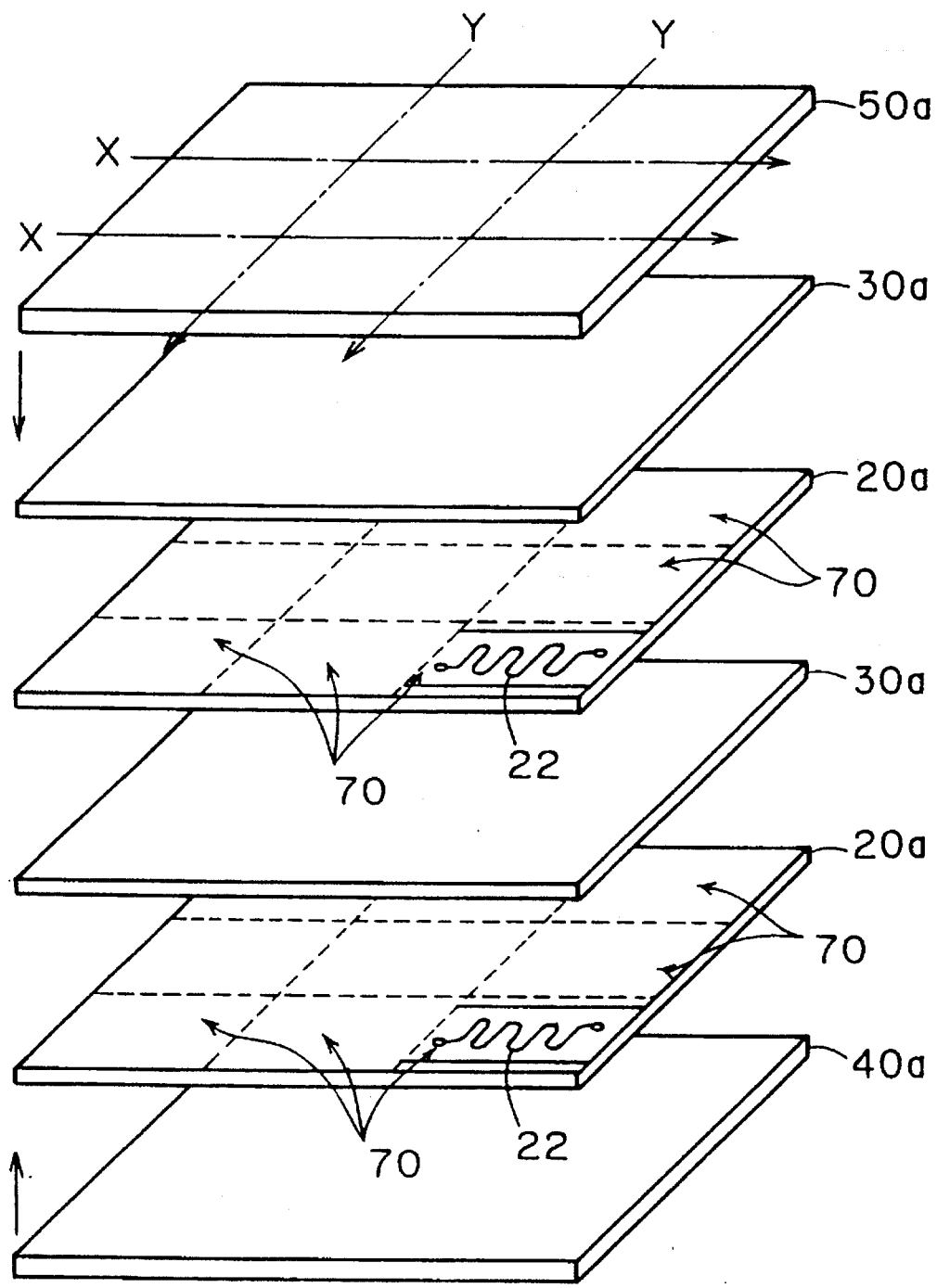
FIG. 10 is a view describing one example of a method of manufacturing delay line devices according to the present invention.

As illustrated in FIG. 10, the respective first and second mother substrates 20a and 30a are alternately stacked on one another in such a manner that the bonding electrodes of the respective first mother substrates 20a face those of the respective second mother substrates 30a. Further, the mother dummy substrates 40a and 50a are superimposed on both outer sides of a combination of the respective first and second mother substrates 20a and 30a with the ground electrodes thereof oriented inwardly. In this condition, the so-formed product is subjected to desired pressure and heated to 300° C. or so in a non-oxidizing atmosphere such as a nitrogen atmosphere. Thus, gold-tin alloys are respectively formed by the opposite gold thin films and tin thin films in the manner of which has been previously described in FIGS. 5 and 6 to thereby form a laminated or a layered board.

Next, a resin having a dielectric constant lower than that of the ceramic substrate forming each of the respective first and second mother substrates 20a and 30a is charged into spacings existing in the layered board. Examples of the resin include an epoxy resin, a polyimide resin, etc. A vacuum impregnating method may preferably be used as such a resin charging method. However, a method of slowly sinking the layered board into the resin in the atmosphere and the like may be used.

After the resin has been hardened, the layered board is then cut every conductive patterns 70 including the signal lines 22 provided thereinside. That is, the layered board is cut in X and Y directions shown in FIG. 10 in the case of the example illustrated in the same drawing to thereby produce a plurality of delay line devices.

The multi-layered structure type delay line device like the above-described delay line device 60 can be manufactured in plural form at a time in accordance with the aforementioned steps.

According to such a manufacturing method, a plurality of delay line devices each having the aforementioned excellent characteristics can be manufactured at one time. Therefore, the efficiency of production of the delay line devices and their productivity can be improved. Further, a plurality of delay line devices whose characteristics are uniform can be easily obtained.

Incidentally, the above described delay line unit 10 or the delay line device having the dummy substrates provided at the upper and lower positions can also be manufactured in plural form at a time in a manner similar to the multi-layered structure type delay line device except that the first and second mother substrates 20a and 30a are respectively used one by one.

A description will next be made of the result of trial manufacture of the three-layered structure (i.e., including the three delay line units 10a through 10c) type delay line device 60 illustrated in FIGS. 7 through 9 in accordance with the manufacturing method illustrated in FIG. 10.

An alumina substrate having a length and a width of 84×80 mm and a thickness of 0.4 mm was used as each of the ceramic substrates which respectively form the mother substrates 20a and 30a. Further, an alumina substrate, which has a thickness of 0.63 mm and is identical in length and width to the above alumina, was used as each of the ceramic substrates which respectively form the mother dummy substrates 40a and 50a.

As the method of forming the conductive patterns on the surfaces of the respective mother substrates 20a and 30a and those of the respective mother dummy substrates 40a and 50a respectively, a method of depositing a thin film of an alloy of nickel and chromium on the entire regions of both main surfaces of each ceramic substrate and a thin film of copper on the Ni—Cr thin film respectively by sputtering and thereafter etching the resultant product in a desired pattern was used. As described with reference to FIG. 5, copper having a thickness of 20 μm was further formed on the copper thin films other than the thin films corresponding to the bonding electrodes 33 by plating with a view toward reducing the electrical resistance, for example.

The pattern of each signal line is identical to that of the signal line 22 shown in FIGS. 2 and 3A. The width of each signal line was set to 80 μm and the distance between the adjacent portions of the signal line was set to 200 μm.

Further, the through holes were punched by the laser. The diameter of each through hole was set to about 0.1 mm. Moreover, the copper plating was effected on the inside of each through hole in the same manner as described above.

Then, the gold plating was made onto the surfaces of the respective mother substrates 20a and the mother dummy substrate 50a. The gold plating was effected on the surfaces of the respective mother substrates 30a and the mother dummy substrate 40a and the surfaces thereof were further tinned.

After the respective mother substrates 20a and 30a and the mother dummy substrates 40a and 50a have been stacked on one another as described above, they are heated to 300° C. in the nitrogen atmosphere and bonded together.

Further, a polyimide resin is charged into spacings existing in the resultant layered board by vacuum impregnating method. After the resin has been hardened, the resultant product is cut into a plurality of delay line devices, each of which is 12.5×5 mm in length and width. The soldering bumps 62 shown in FIG. 9 are then mounted on the respective delay line device. As a result, the delay line device 60 shown in FIG. 9 was obtained in plural form.

Figure 11:
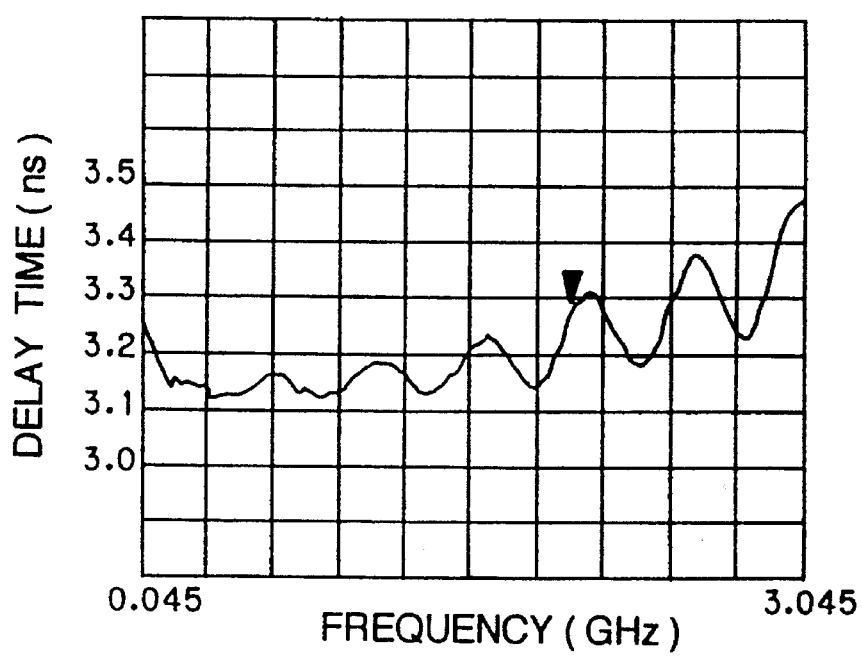
FIG. 11 is a graph describing one example of a delay time characteristic of a delay line device according to the present invention.
Figure 16:
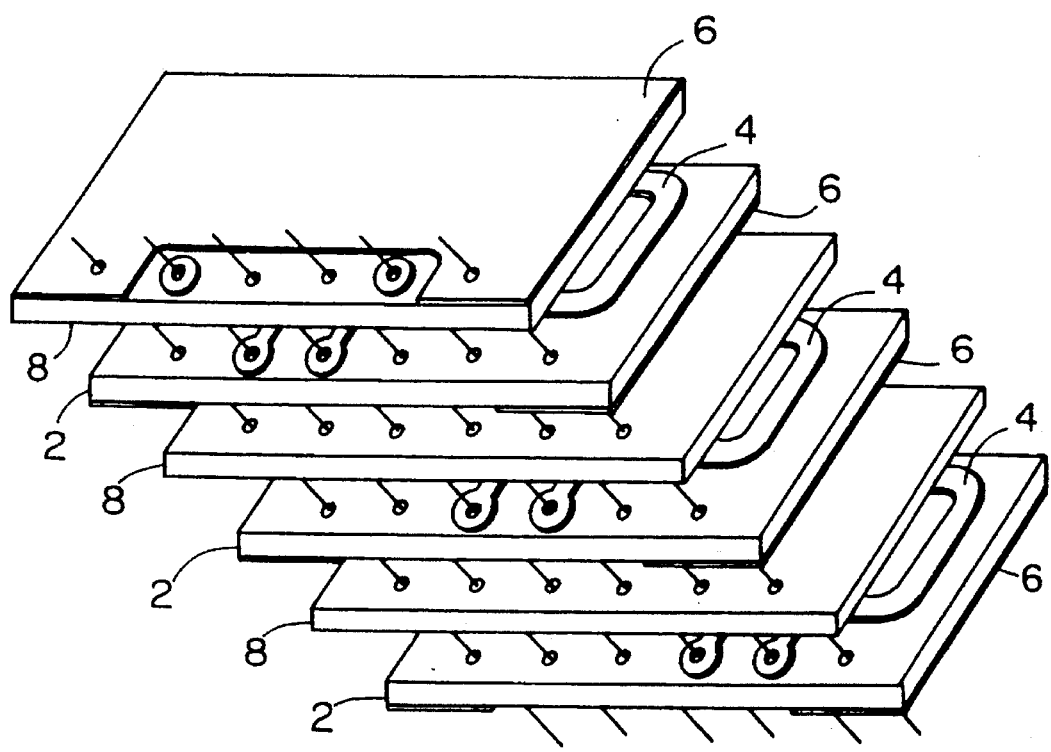
FIG. 16 is an exploded perspective view showing one example of a conventional delay line device which is of a triplate type and has a layered structure.

FIG. 11 shows the result of measurement of a delay time of each of the so-obtained delay line devices each having the three-layer structure. As is understood from FIG. 11, the delay time of each delay line device falls within a range of 3.2±0.1 nanoseconds up to 2 GHz. The delay time remains unchanged up to a very high frequency range. Incidentally, a delay time of the conventional delay line device shown in FIG. 16, which have been obtained by using conventional adhesive sheets each made of an organic material, does not fall within a variation range of ±0.1 nanoseconds except the frequency is less than or equal to about 500 MHz.

Figure 12:
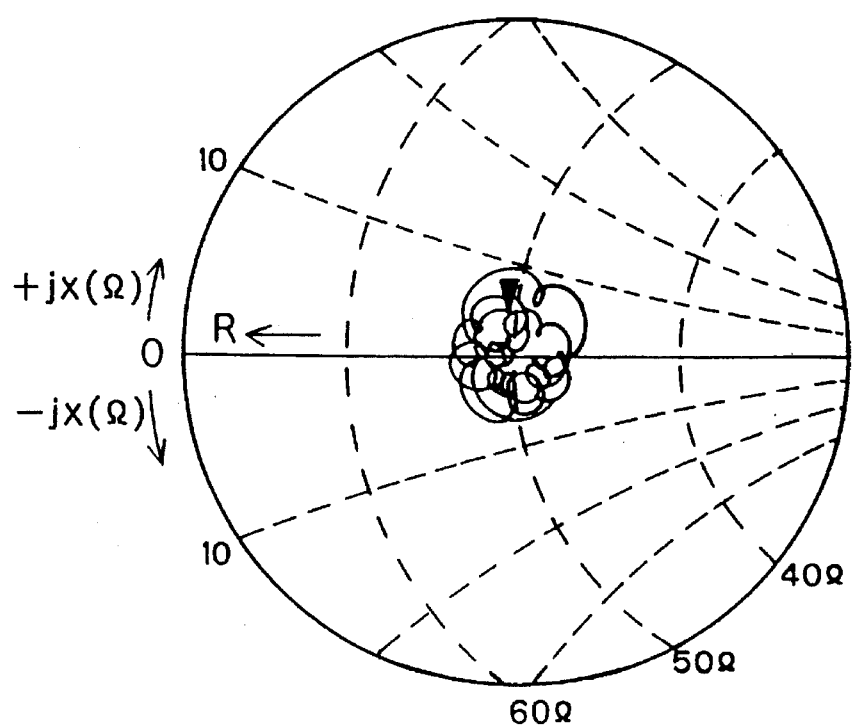
FIG. 12 is a Smith chart for describing one example of an impedance characteristic of the delay line device used in FIG. 11.
Figure 14:
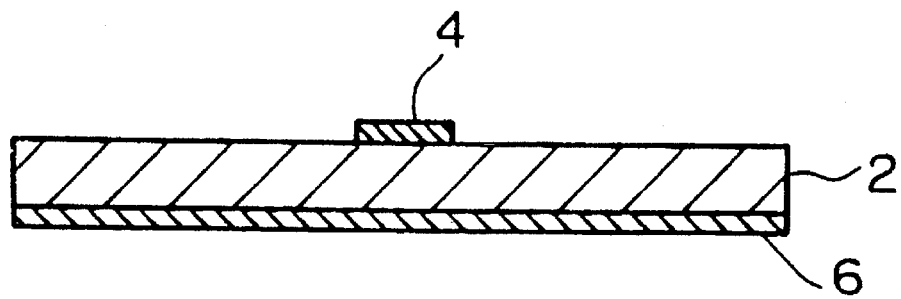
FIG. 14 is a schematic cross-sectional view showing one example of a conventional delay line device having a microstrip line structure.
Figure 15:
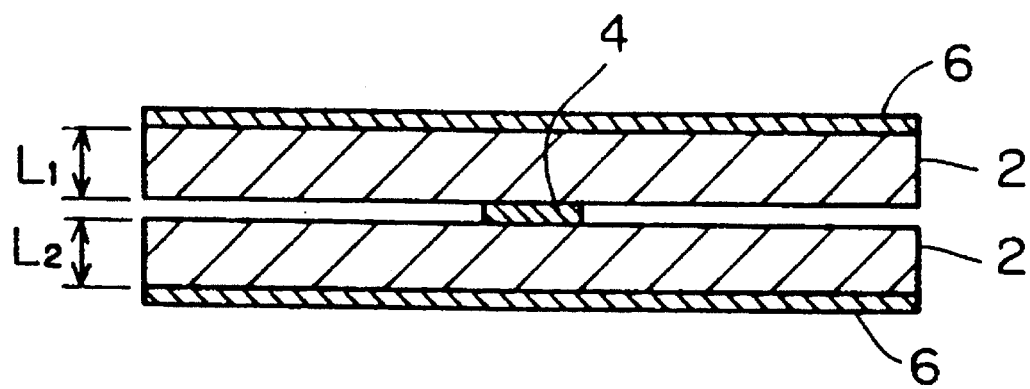
FIG. 15 is a schematic cross-sectional view depicting one example of a conventional delay line device having a triplate type stripline structure.

The result of measurement of an impedance characteristic of the delay line device will be shown on the Smith chart in FIG. 12. A vortex shown in the same drawing represents a variation in impedance at the time that the frequency is in a range of 0.045 GHz to 3.045 GHz. As is understood from its representation, a resistive component of the impedance of the delay line device falls within a range of 50±5 Ω in the above frequency range, whereas a reactance component thereof falls within a range of 0±10 Ω. Thus, the impedance also remains stable up to a very high frequency range.

Accordingly, each of the delay line devices referred to above can respond sufficiently to a high-speed signal having a frequency extending up to at least 2 GHz.

As a result of various tests related to the reliability necessary for each electronic part, such as a high-temperature and high-humidity test and a temperature cycling test, each of the above delay line devices has satisfied characteristics required of all the items.

The number of layers to be stacked of the aforementioned multi-layered structure type delay line device is not necessarily limited to three as shown in FIGS. 7 through 9 or two as illustrated in FIG. 10. The number of the layers can be set to a range of from one or more to a desired number according to the required delay time or the like.

Further, the electronic part can be set to various shapes as needed as illustrated in FIGS. 13A through 13H, for example. FIGS. 13A and 13B show a soldering bump type delay line device provided with soldering bumps 62 in a manner similar to the delay line device shown in FIG. 9. FIGS. 13C and 13D illustrate a flat package type delay line device wherein terminals 64 have been taken out only from a dummy substrate provided on the lower side thereof. FIGS. 13E and 13F depict a small outline package (SOP) type delay line device in which terminals 64 each bent in the form of an L letter have been drawn only from dummy substrates provided on both sides thereof. FIG. 13G shows a dual in-line package (DIP) type delay line device in which terminals 64 have been vertically taken out from dummy substrates provided on both sides thereof. FIG. 13H illustrates a single in-line package (SIP) type delay line device wherein terminals 64 have been drawn in alignment from dummy substrates provided on beth sides thereof.

Having now fully described the invention, it will be apparent to those skilled in the art that many changes and modifications can be made without departing from the spirit or scope of the invention as set forth herein.

What is claimed is:

1. A method of manufacturing delay line devices, comprising the following steps:

a step of preparing a first mother substrate having a plurality of signal lines formed on a first main surface of a first ceramic substrate, bonding electrodes respectively formed adjacent to peripheral portions of said signal lines, a ground electrode formed over substantially the entire region of a second main surface of said first ceramic substrate, and through holes providing electrical connections between said ground electrode and said respective bonding electrodes, said bonding electrodes and said ground electrode comprising gold thin films formed on conductors provided on said first and second main surfaces, respectively, of said first ceramic substrate;

a step of preparing a second mother substrate having bonding electrodes respectively formed on a first main surface of a second ceramic substrate identical in thickness and material to the first ceramic substrate of said first mother substrate and at positions corresponding to the respective bonding electrodes of said first mother substrate, a ground electrode formed over substantially the entire region of a second main surface of said second ceramic substrate, and through holes providing electrical connections between said ground electrode and said bonding electrodes, said bonding electrodes and ground electrodes of said second mother substrate comprising tin thin films formed on conductors provided on said first and second main surfaces, respectively, of said second ceramic substrate;

a step of preparing two mother dummy substrates each having a ground electrode formed over substantially the entire region of respective first main surfaces of third and fourth ceramic substrates, each of said third and fourth substrate greater in thickness than the first and second ceramic substrates, respectively, of said first and second mother substrates, one of said two mother dummy substrates having tin thin films formed on its respective ground electrode and the other mother dummy substrate having gold thin films formed on its respective grounding electrode;

a first step of superposing said first and second mother substrates on one another in such a manner that the respective bonding electrodes of said first and second mother substrates are disposed in facing relationship to one another, a second step of superposing said two mother dummy substrates on both outer sides of said superposed first and second mother substrates with the ground electrodes thereof oriented inwardly, applying pressure to the product obtained by said second superposition and heating the same in a non-oxidizing atmosphere to form gold-tin alloys from the opposing gold and tin thin films and to produce a layered board;

a step of charging a resin having a dielectric constant lower than that of each of the first and second ceramic substrates of said first and second mother substrates into spacings existing in said layered board; and a step of cutting said layered board to produce a plurality of delay line devices including said signal lines.

2. A method of manufacturing delay line devices comprising the following steps:

a step of preparing a plurality of first mother substrates each having:
a plurality of signal lines formed on a first main surface of a respective first ceramic substrate, bonding electrodes formed adjacent peripheral portions of said signal lines, a ground electrode formed over substantially the entire region of a second main surface of said respective first ceramic substrate, through holes providing electrical connections between said ground electrode and said bonding electrodes, and through hole terminals formed in the peripheral portions of said signal lines, said bonding electrodes and ground electrode comprising gold thin films respectively formed on conductors provided on both first and second main surfaces of said first ceramic substrate;

a step of preparing a plurality of second mother substrates each having:
bonding electrodes formed on a first main surface of a respective second ceramic substrate identical in thickness and material to the respective first ceramic substrate at positions corresponding to the respective bonding electrodes of said each first mother substrate, a ground electrode formed over substantially the entire region of a second main surface of said second ceramic substrate, through holes providing electrical connections between said ground electrode and said respective bonding electrodes, and through hole terminals provided at positions corresponding to the respective through hole terminals of said each first mother substrate, said bonding electrodes and ground electrode of each said second mother substrates comprising tin thin films formed on conductors provided on both first and second main surfaces of said second ceramic substrate;

a step of preparing two mother dummy substrates each having a ground electrode formed over substantially the entire region of respective first main surfaces of third and fourth ceramic substrates, each of said third and fourth substrates greater in thickness than the first and second ceramic substrate, respectively, of each of said plurality of first and second mother substrates, at least one of said two mother dummy substrates having through hole terminals, one of said two mother dummy substrates having tin thin films formed on the respective grounding electrode and the other of said two mother dummy substrates having gold thin films formed on its respective ground electrode;

a first step of alternately superposing said plurality of first and second mother substrates on one another in such a manner that the bonding electrodes of said plurality of first mother substrates face those of said plurality of second mother substrates, and a second step of superposing said two mother dummy substrates on both outer sides of said plurality of superposed first and second substrates with the ground electrodes of said two mother dummy substrates oriented inwardly, applying pressure to the product obtained by said second superposition and heating the same in a non-oxidizing atmosphere to form gold-tin alloys from the opposing gold and tin thin films and to produce a layered board;

a step of charging a resin having a dielectric constant lower than that of each of the ceramic substrates of said plurality of first and second mother substrates into spacings existing in said layered board; and a step of cutting said layered board to produce a plurality of delay line devices including signal lines.

\* \* \* \* \*